United States Patent [19]

Steele et al.

[11] Patent Number: 5,358,895
[45] Date of Patent: Oct. 25, 1994

[54] LOW TEMPERATURE SILICON EPITAXY WITH GERMANIUM DOPING

[75] Inventors: John W. Steele, Chandler; Cliff Stein, Gilbert, both of Ariz.

[73] Assignee: Motorola, Inc., Schaumburg, Ill.

[21] Appl. No.: 67,888

[22] Filed: May 27, 1993

[51] Int. Cl.$^5$ .............................................. H01L 21/00
[52] U.S. Cl. ...................... 437/80; 437/106; 437/131; 437/108
[58] Field of Search ................. 437/80, 106, 131, 108

[56] References Cited

U.S. PATENT DOCUMENTS

| | | |
|---|---|---|
| 4,564,509 | 1/1986 | Shealy et al. |
| 5,097,308 | 3/1992 | Salih |
| 5,120,394 | 6/1992 | Mukai .............................. 156/610 |
| 5,216,271 | 6/1993 | Takagi .............................. 29/163 |
| 5,227,330 | 7/1993 | Agnello ........................... 437/108 |
| 5,256,550 | 10/1993 | Laderman ....................... 437/106 |
| 5,684,411 | 1/1992 | Laderman ....................... 437/131 |

OTHER PUBLICATIONS

J. L. Hoyt et al., "Limited Reaction Processing: Growth of Si$_{1-x}$Ge$_x$/Si for Heterojunction Bipolar Transistor Applications," Thin Solid Films, 184(1990)93 106, pp. 93–106.
T. I. Kamins et al., "Electrical Characteristics of Diodes Fabricated in Selective Si/Si$_{1-x}$Ge$_x$ Epitaxial Layers", Journal of Electronic Materials, vol. 21, No. 8, 1992, pp. 817–824.
Marco Racanelli et al., "Ultrahigh-Vacuum CVD Epitaxy of Silicon and Ge$_x$Si$_{1-x}$", JOM, Oct. 1991, pp. 32–37.
Raymond P. Roberge et al., "Gaseous Impurity Effects in Silicon Epitaxy", 1986 Union Carbide Corporation and Gemini Research, Incorporated, pp. 111–121.
J. Bloem, "The Effect of Trace Amounts of Water Vapor on Boron Doping in Epitaxially Grown Silicon", J. Electrochem. Soc. vol. 118, No. 11, publication date unknown, pp. 837–1841.
Kohetsu Tanno et al., "Selective Silicon Epitaxy Using Reduced Pressure Technique", Japanese Journal of Applied Physics, vol. 21, No. 9, Sep., 1982, pp. L564–L566.
S. P. Weeks, "Pattern Shift and Pattern Distortion During CVD Epitaxy on (111) and (100) Silicon", Solid State Technology, Nov. 1981, pp. 111–117.
T. O. Sedgwick et al., "Growth of Facet-Free Selective Silicon Epitaxy at Low Temperature and Atmospheric Pressure", J. Electrochem. Soc., vol. 138, No. 10, Oct. 1991, pp. 3042–3047.
John C. Beam, "Strained-Layer Epitaxy of Germanium-Silicon Alloys", Science, 11 Oct. 1985, vol. 230, No. 4722, pp. 127–131.
A. Yamada et al., "Gas Source Molecular-Beam Epitaxy of Si and GiGe Using Si$_2$H$_6$ and GeH$_4$", J. Appl. Phys. 69(2), 15 Jan. 1991, pp. 1008–1012.
Rozgonyi, Kola; "Defect Engineering for ULSI Epitaxial Silicon Solid State Data B", Solid State Phenom.

*Primary Examiner*—R. Bruce Breneman
*Assistant Examiner*—Joni Chang
*Attorney, Agent, or Firm*—Miriam Jackson

[57] ABSTRACT

A non-strained epitaxial layer is formed to have a small transition width and a low amount or no amount of oxygen incorporated therein. During the formation of non-strained epitaxial layer, a germanium source gas is introduced. Germanium reacts with water and/or oxygen to form GeO, which sublimates from the surface of the non-strained epitaxial layer, instead of oxygen being incorporated into the lattice. Thus, a low temperature epitaxial process can be used to obtain the small transition width without having oxygen incorporated into the non-strained epitaxial layer.

12 Claims, 2 Drawing Sheets

FIG. 1
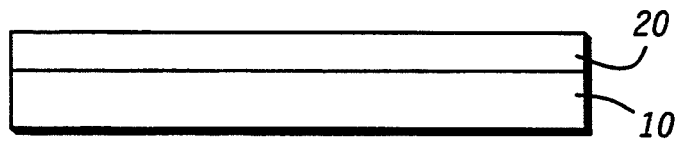
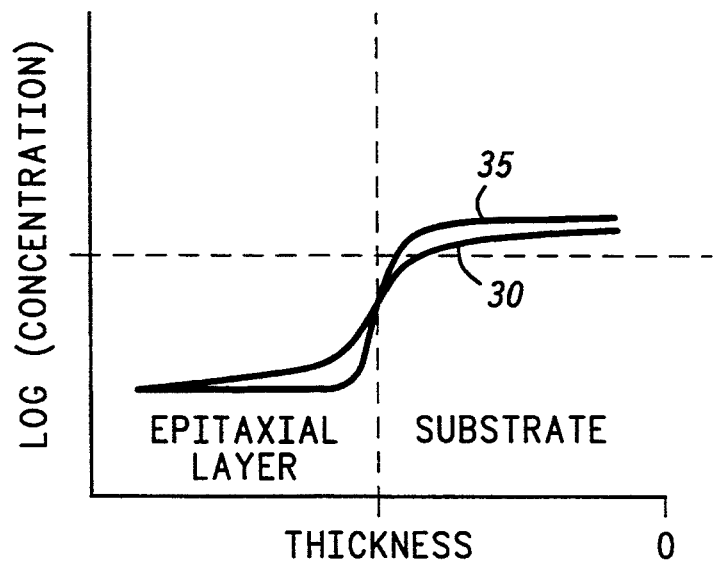
FIG. 2
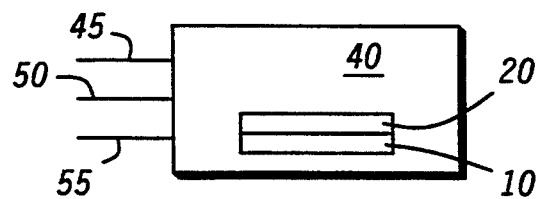
FIG. 3

LOW TEMPERATURE SILICON EPITAXY WITH GERMANIUM DOPING

BACKGROUND OF THE INVENTION

This invention relates, in general, to semiconductor materials, and more particularly, to a low temperature silicon epitaxy.

It is desirable to use low temperature (less than 900° C.) processing when growing silicon epitaxial layers on a semiconductor substrate to limit the autodoping effects and the diffusion length of dopants out of the substrate. The amount or thickness of the epitaxial layer formed before the desired dopant profile is obtained is called the transition width.

The use of low temperature, however, increases the incorporation of oxygen ($O_2$) into the silicon epitaxy. The oxygen can cause oxygen induced stacking faults or act as a contaminant which creates a barrier to electron mobility. Both of which can be detrimental to semiconductor devices formed in the silicon epitaxial layer.

It would be desirable to remove or lower the oxygen incorporation while still using a low temperature epitaxial process. A lower oxygen incorporation would increase the quality of the epitaxial layer by lowering crystal defects and raising the silicon epitaxial layer's charge carrier lifetimes.

A way of reducing the amount of oxygen incorporated into a silicon epitaxial layer is to use ultra-high vacuum CVD epitaxy, utilizing a base pressure of $1 \times 10^{-9}$ torr and process pressure in the range of $1 \times 10^{-3}$ torr. This ultra-high vacuum CVD process removes oxygen and water ($H_2O$) vapor so that less oxygen is available to incorporate into the silicon epitaxy during growth. The use of ultra-high vacuum CVD, however, in a manufacturing setting is not very practical because of low throughput and high cost.

Thus, it would be desirable to have a manufacturable process for reducing the amount of oxygen incorporation into a silicon epitaxial layer when forming epitaxial layers at low temperatures.

SUMMARY OF THE INVENTION

A non-strained, germanium doped, silicon epitaxial layer is chemically formed on a substrate in the presence of a germanium source gas resulting in a germanium percentage concentration in the non-strained, germanium doped, silicon epitaxial layer greater than 0% but less than an amount which gives a silicon germanium bandgap significantly different from the bandgap of silicon.

BRIEF DESCRIPTION OF THE DRAWINGS

FIG. 1 illustrates a simplified view of an embodiment of the present invention;

FIG. 2 illustrates a graph of the dopant concentration profile of an epitaxial layer grown on a substrate;

FIG. 3 illustrates a cross-sectional view of an embodiment of the present invention;

DETAILED DESCRIPTION OF THE DRAWINGS

Figure 4:
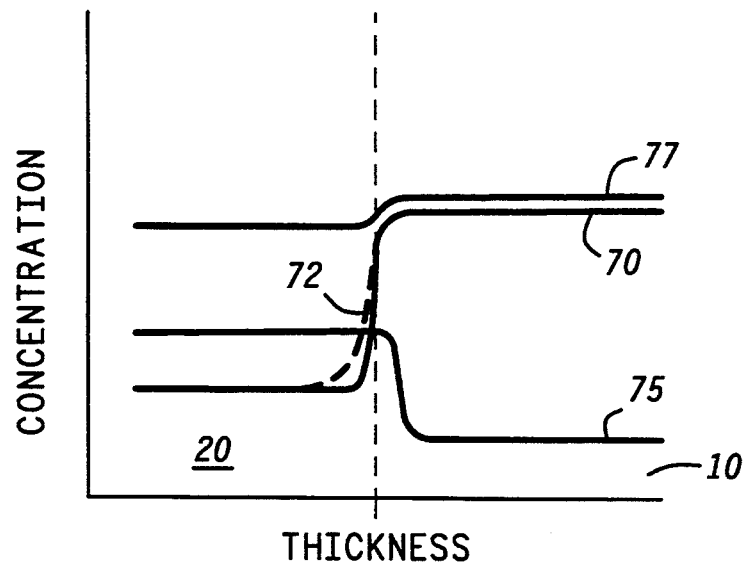
FIG. 4 illustrates a graph of various concentrations in an epitaxial and substrate layer.

FIG. 1 illustrates a cross-sectional view of an embodiment of the present invention. What is shown, is substrate 10 having a non-strained, germanium doped, silicon epitaxial layer 20 (hereinafter non-strained epitaxial layer) formed thereon. Non-strained epitaxial layer 20 of the present invention is formed to have a small transition width and a low amount or no amount of oxygen incorporated therein, as will be described below. Substrate 10 may be comprised of a suitable semiconductor material, preferably silicon.

FIG. 2 illustrates a graph of the thickness of an epitaxial layer and a semiconductor substrate versus the dopant concentration therein. Curve 30 illustrates a dopant (N or P type) concentration after the epitaxial layer is formed on the semiconductor substrate using a high temperature epitaxial process, while curve 35 illustrates a dopant concentration after an epitaxial layer is formed on a semiconductor substrate using a low temperature epitaxial process. Note that the transition width of the epitaxial layer formed at the high temperature is wider relative to the transition width of the epitaxial layer formed at a low temperature. It is desirable to have this transition width minimized because it is desirable to form thinner epitaxial layers in order to achieve better electrical performance of the semiconductor devices which are formed in the epitaxial layer. If the transition width is large, a thicker epitaxial layer must be formed in order to achieve an epitaxial layer thickness having the desired constant concentration.

As explained previously, the disadvantage of using a low temperature epitaxial process is that it causes an increased incorporation of oxygen into the epitaxial layer. Oxygen which is incorporated into the epitaxial layer lattice causes oxygen induced stacking faults and the oxygen creates a barrier to electron mobility. As will be described below, the present invention allows for the use of a low temperature epitaxial process, without resulting in increased incorporation of oxygen into the epitaxial layer.

FIG. 3 illustrates a simplified view of the process utilized in the present invention. A reaction chamber 40 which forms non-strained epitaxial layer 20 on substrate 10 is equipped with silicon source gases 45, dopant gases 50, and a germanium source gas 55. At the present time, germanium source gas 55 can be comprised of germane ($GeH_4$), however, other compositions may be available in the future.

In a preferred embodiment, silicon source gases 45 are comprised of $SiCl_3H$, $SiCl_2H_2$, $SiH_4$, or $Si_2H_6$. These gases are typical silicon source gases used in the art. Other silicon source gases may be used, except that silicon source gases 45 being able to react at a reaction temperature of above 1100° C. will not be as effective in the present invention, due to the decreased reactiveness of germanium source gas 55. For example, $SiCl_4$ requires the use of a temperature approximately 1150° C. or higher. Most preferably, silicon source gases 45 requiring a temperature of less than or equal to 900° C. are used. This includes silicon source gases 45 such as $SiCl_2H_2$, $SiH_4$, or $Si_2H_6$. A temperature of less than 900° C. will be effective in reducing the transition width between substrate 10 and non-strained epitaxial layer 20 and will also increase the reactiveness of germanium source gas 55.

Dopant gas 35 is used to achieve desired doping types and levels in non-strained epitaxial layer 20. Dopant gas 35 may be chosen, for example, from the list comprising arsine, phosphine, diborane, or other gases. Epitaxial layer 20 may be doped N- or P-type.

The temperature and pressure used to form the non-strained epitaxial layer will affect the growth rate. In this particular example, a base pressure of 1 millitorr is used. It is preferable that the present invention be utilized in a chemical reaction rather than a physical reaction (as molecular beam epitaxy) because, physical reactions normally operate at ultra-high pressures at which oxygen is removed.

Before the non-strained epitaxial layer is formed on substrate 10, a pre-clean of substrate 10 is performed to remove any silicon dioxide (oxide) thereon. In a preferred embodiment, the pre-clean is comprised of a wet chemical clean to remove any silicon dioxide present. Then, semiconductor substrate 10 is placed in reaction chamber 40. A high temperature pre-bake may be utilized to remove any remaining silicon dioxide on substrate 10. The pre-clean and/or the high temperature pre-bake may be utilized.

In a preferred embodiment, germanium source gas 55 is introduced into reaction chamber 40 before the formation of non-strained epitaxial layer 20 begins. Germanium source gas 55 acts as a pre-clean to remove any oxygen present in the chamber 40. Germanium reacts with $H_2O$ and $O_2$ to form a germanium monoxide (GeO) which can be removed through an exhaust (not shown).

During the formation of non-strained epitaxial layer 20, germanium source gas 55 is introduced into reaction chamber 40. During the formation of non-strained epitaxial layer 20, the reaction between germanium and water or oxygen forms GeO, which sublimates from the surface of the non-strained epitaxial layer, instead of oxygen being incorporated into the lattice.

Thus, the use of germanium source gas 55 allows one to go to a lower temperature to form non-strained epitaxial layer 20 to obtain the shorter transition width, while not incorporating or minimizing the incorporation of oxygen into non-strained epitaxial layer 20. A lower temperature also decreases the growth rate of an epitaxial layer. In the past, a higher silicon source gas flow rate was used to increase the growth rate, but this caused even more incorporation of oxygen into the epitaxial layer. In the present invention, a higher silicon source gas 45 flow rate can be used without incorporation or with minimal incorporation of oxygen, which results in a better quality non-strained epitaxial layer 20 and higher throughput.

The amount of germanium source gas 55 (flowrate and % of Ge) used will depend on how much oxygen is present in reaction chamber 40. An amount of germanium may not react with the oxygen; that amount will be incorporated into non-strained epitaxial layer 20. However, the maximum amount of germanium source gas 55 which is used in the present invention is an amount which, when incorporated into non-strained epitaxial layer 20, does not substantially change the electrical characteristics of a silicon epitaxial layer. The bandgap of non-strained epitaxial layer 20 (silicon germanium bandgap) remains substantially unchanged relative to that of silicon by introduction or incorporation of germanium into non-strained epitaxial layer 20. In other words, the electrical characteristics of non-strained epitaxial layer 20 are essentially the same as a silicon epitaxial layer.

In a preferred embodiment, the amount of germanium incorporated into non-strained epitaxial layer 20 is in the range of greater than 0% but less than or equal to 1%. This amount has been found not to alter the bandgap of silicon in a significant way. It is also important to note that non-strained epitaxial layer 20 is formed without any strain and remains non-strained. Below a certain Ge fraction in SiGe, it does not matter what the thickness of the SiGe layer is; it is formed and remains non-strained. This germanium fraction is believed to be approximately 3%. Non-strained epitaxial layer 20 of the present invention should not be confused with a strained epitaxial layer in which the bandgap of silicon is altered. With a germanium fraction above 3%, the SiGe layer as formed will be "strained." Strained epitaxial layers are typically used to form heterojunction devices. The thickness of the SiGe will have to be above a certain critical thickness so that the SiGe lattice relaxes and becomes "unstrained." It is also important to note that an unstrained SiGe layer is not the same as non-strained epitaxial layer 20 of the present invention.

FIG. 4 illustrates a graph of the depth of non-strained epitaxial layer 20 and substrate 10 formed in the present invention versus the concentration of various dopants therein. Curve 70 illustrates the doping of substrate 10 and into non-strained epitaxial layer 20 formed using the low temperature process of the present invention. Dashed line 72 illustrates the portion of the dopant concentration that would be formed utilizing a high temperature process used in the prior art. Note that if a small transition width is not critical, the present invention can still be used to reduce oxygen incorporation. Curve 75 illustrates the concentration of germanium present in non-strained epitaxial layer 20. The resolution of detection of germanium only goes down to a certain level thus, substrate 10 is shown to have germanium present, although none may be detectable. Curve 77 shows the concentration of oxygen present in substrate 10 and non-strained epitaxial layer 20. Note that the concentration of oxygen in the non-strained epitaxial layer 20 is approximately $5 \times 10^{18}$ atoms/cm$^3$ by using germanium during the formation of non-strained epitaxial layer 20. This oxygen concentration using a low temperature epitaxial process of the prior art, without germanium, would probably be in the range of $1 \times 10^{19}$ atoms/cm$^3$ or greater.

Figure 5:
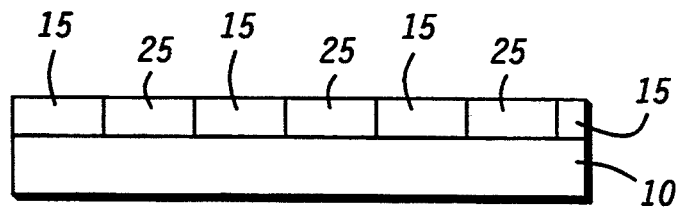
FIG. 5 illustrates a cross-sectional view of a second embodiment of the present invention.

FIG. 5 illustrates a second embodiment of the present invention. What is shown, is a substrate 10 having an insulative layer 15 formed thereon, having selected portions removed. FIG. 5 illustrates that a selective epitaxial process can be used in the present invention to form a selective epitaxy 25. An advantage obtained when using a selective epitaxial process with the present invention is that a lower temperature increases the selectivity and reduces the amount of faceting of selective non-strained epitaxial layer 25 adjacent to insulative layer 15. Adding germanium source gas 55 during the selective epitaxial process also increases the selectivity because the lower the oxygen level present, the more selective the process is. Higher selectivity means that selective non-strained epitaxial layers 35 will not be formed on insulative layer 15.

As can be seen, the present invention enables one to obtain a small transition width by using a low temperature epitaxial process without having a detrimental amount of oxygen incorporated into the epitaxial layer.

When the present invention is used with a selective epitaxial process, all of the advantages disclosed above are obtained, as well as increased selectivity.

We claim:

1. A method of forming a non-strained, germanium doped, silicon epitaxial layer, comprising the steps of:
    providing a substrate; and
    forming the non-strained, germanium doped, silicon epitaxial layer in the presence of a germanium source gas wherein the germanium reacts with oxygen to form a germanium oxide which sublimates from the surface of the non-strained, germanium doped, silicon epitaxial layer during formation resulting in a germanium percentage concentration in the non-strained, germanium doped, silicon epitaxial layer
wherein electrical characteristics of the non-strained, germanium doped, silicon epitaxial layer are essentially the same as a silicon epitaxial layer.

2. The method of claim 1 wherein the germanium source gas is germane.

3. The method of claim 1 further comprising forming the non-strained, germanium doped, silicon epitaxial layer in the presence of a dopant gas which alters the electrical conductivity of the non-strained, germanium doped, silicon epitaxial layer.

4. The method of claim 1 further comprising the step of removing any oxide present on the surface of the substrate prior to forming the non-strained, germanium doped, silicon epitaxial layer.

5. The method of claim 1 further comprising the step of baking the substrate to remove any oxide present on the surface of the substrate prior to forming the non-strained, germanium doped, silicon epitaxial layer.

6. A method of forming a non-strained, germanium doped, silicon epitaxial layer, comprising the steps of:
    providing a substrate:
    removing any oxygen present in a reaction chamber prior to forming the non-strained, germanium doped, silicon epitaxial layer in the reaction chamber by introducing a germanium source gas into the reaction chamber; and
    forming the non-strained; germanium doped, silicon epitaxial layer in the presence of a germanium source gas.

7. The method of claim 1 wherein forming the non-strained, germanium doped, silicon epitaxial layer comprises using $SiCl_3H_1$, $SiCl_2H_2$, $SiH_4$, or $Si_2H_6$.

8. A method of forming a non-strained, germanium doped, silicon epitaxial layer, comprising the steps of:
    providing a substrate; and
    forming the non-strained, germanium doped, silicon epitaxial layer in the presence of a germanium source gas
wherein the germanium reacts with oxygen and substantially all of the germanium sublimates from the surface of the non-strained, germanium doped, silicon epitaxial layer during formation.

9. The method of claim 1 wherein forming the non-strained, germanium doped, silicon epitaxial layer comprises using a germanium concentration which results in greater than 0%, but less than 1% germanium incorporated into the non-strained, germanium doped, silicon epitaxial layer.

10. The method of claim 1 wherein forming the non-strained, germanian doped, silicon epitaxial layer comprises using a temperature of approximately 1100° C. or less.

11. The method of claim 1 wherein forming the non-strained, germanium doped, silicon epitaxial layer comprises using a temperature of approximately 900° C. or less.

12. A method of forming a non-strained, germanium doped, silicon epitaxial layer, comprising the steps of:
    providing a substrate; and
    forming the non-strained, germanium doped, silicon epitaxial layer in the presence of a germanium source gas resulting in a germanium percentage concentration in the non-strained, germanium doped, silicon epitaxial layer greater than 0% but less than or equal to 1%.

* * * * *